United States Patent
Kim et al.

(10) Patent No.: US 11,637,252 B2
(45) Date of Patent: Apr. 25, 2023

(54) DISPLAY APPARATUS INCLUDING A SUBSTRATE HAVING A HOLE

(71) Applicant: SAMSUNG DISPLAY CO., LTD., Yongin-si (KR)

(72) Inventors: Sunkwang Kim, Yongin-si (KR); Kinyeng Kang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 57 days.

(21) Appl. No.: 16/182,119

(22) Filed: Nov. 6, 2018

(65) Prior Publication Data

US 2019/0074459 A1    Mar. 7, 2019

Related U.S. Application Data

(63) Continuation of application No. 15/294,452, filed on Oct. 14, 2016, now Pat. No. 10,135,010.

(30) Foreign Application Priority Data

Oct. 16, 2015  (KR) .................. 10-2015-0144991

(51) Int. Cl.
*H01L 51/00*  (2006.01)
*H01L 51/52*  (2006.01)
(Continued)

(52) U.S. Cl.
CPC ...... *H01L 51/0096* (2013.01); *H01L 27/3244* (2013.01); *H01L 27/3258* (2013.01);
(Continued)

(58) Field of Classification Search
CPC ............ H01L 27/3258; H01L 51/5253; H01L 51/0096; H01L 51/5256; H01L 51/5246;
(Continued)

(56) References Cited

U.S. PATENT DOCUMENTS 9,105,871 B2   8/2015  Hamm
2003/0198141 A1  10/2003  Brewer et al.
(Continued)

FOREIGN PATENT DOCUMENTS

JP    2006-059582    3/2006
JP    2009-162552    7/2009
(Continued)

OTHER PUBLICATIONS

U.S. OA dated Dec. 13, 2017 in Related U.S. Appl. No. 15/294,452.
(Continued)

*Primary Examiner* — Lex H Malsawma
*Assistant Examiner* — Eric W Jones
(74) *Attorney, Agent, or Firm* — F. Chau & Associates, LLC

(57) ABSTRACT

A display apparatus includes a substrate including at least one hole disposed in a hole area of the substrate, a thin film transistor disposed on the substrate, a light-emitting component disposed on the substrate and electrically connected to the thin film transistor, an insulating layer disposed on the substrate, a thin film encapsulation layer disposed on the substrate, and a laser blocking layer. The substrate includes a display area and a non-display area that is disposed between the display area and the hole area. The laser blocking layer is disposed on the insulating layer in the non-display area.

49 Claims, 12 Drawing Sheets

(51) Int. Cl.
*H01L 27/32* (2006.01)
*H01L 27/12* (2006.01)

(52) U.S. Cl.
CPC ...... *H01L 51/0017* (2013.01); *H01L 51/5246* (2013.01); *H01L 51/5256* (2013.01); *H01L 27/1237* (2013.01); *H01L 2227/323* (2013.01); *Y02E 10/549* (2013.01); *Y02P 70/50* (2015.11)

(58) Field of Classification Search
CPC ............ H01L 51/0017; H01L 27/3244; H01L 27/1237; H01L 2227/323; Y02P 70/50; Y02E 10/549
USPC .............. 257/40, 59; 438/149; 313/509, 512
See application file for complete search history.

(56) References Cited

U.S. PATENT DOCUMENTS

| | | | |
|---|---|---|---|
| 2004/0051451 A1* | 3/2004 | Kawase | H01L 27/3293 313/512 |
| 2005/0046346 A1 | 3/2005 | Tsuchiya et al. | |
| 2005/0184927 A1* | 8/2005 | Kwak | H01L 27/3276 345/45 |
| 2006/0033430 A1 | 2/2006 | Peng | |
| 2007/0096631 A1 | 5/2007 | Sung et al. | |
| 2008/0079360 A1* | 4/2008 | Kubota | H01L 51/5246 313/505 |
| 2014/0027743 A1* | 1/2014 | Nishido | B32B 15/20 257/40 |
| 2014/0346445 A1 | 11/2014 | Cho | |
| 2015/0014650 A1 | 1/2015 | Lim et al. | |
| 2015/0102293 A1 | 4/2015 | Cho et al. | |
| 2015/0108438 A1 | 4/2015 | Kim | |
| 2015/0243711 A1 | 8/2015 | Hong et al. | |
| 2015/0380685 A1* | 12/2015 | Lee | H01L 27/3276 257/40 |
| 2016/0274442 A1* | 9/2016 | Rausch | H04N 5/2256 |
| 2017/0110532 A1 | 4/2017 | Kim et al. | |

FOREIGN PATENT DOCUMENTS

| | | |
|---|---|---|
| JP | 2014-96355 | 5/2014 |
| KR | 10-2005-0021963 | 3/2005 |
| KR | 10-0595073 | 6/2006 |
| KR | 10-2015-0043148 | 4/2015 |
| KR | 10-2015-0046646 | 4/2015 |

OTHER PUBLICATIONS

U.S. NOA dated Jul. 6, 2018 in Related U.S. Appl. No. 15/294,452.

* cited by examiner

DISPLAY APPARATUS INCLUDING A SUBSTRATE HAVING A HOLE

CROSS-REFERENCE TO RELATED APPLICATIONS

This application is a continuation application of U.S. patent application Ser. No. 15/294,452 filed Oct. 14, 2016, which claims the benefit of Korean Patent Application No. 10-2015-0144991, filed on Oct. 16, 2015, the disclosures of which are incorporated by reference herein in their entireties.

TECHNICAL FIELD

Exemplary embodiments of the inventive concept relate to display apparatuses.

DISCUSSION OF THE RELATED ART

Display apparatuses may be used in mobile electronic devices such as, for example, smartphones, laptop computers, digital cameras, camcorders, portable information terminals, notebook computers, and tablet personal computers (PCs), as well as other electronic devices such as, for example, desktop computers, televisions, outdoor billboards, and exhibition display apparatuses.

A flexible display apparatus is a type of display apparatus that is easy to carry, and that may be used in electronic devices of various shapes. A flexible display apparatus may use organic light-emitting display technology, and may be used in combination with other mechanical parts.

SUMMARY

Exemplary embodiments of the inventive concept provide a display apparatus in which damage to a substrate at which an insulating layer is disposed may be reduced during manufacture.

According to an exemplary embodiment of the inventive concept, a display apparatus includes a substrate including at least one hole disposed in a hole area of the substrate, a thin film transistor disposed on the substrate, a light-emitting component disposed on the substrate and electrically connected to the thin film transistor, an insulating layer disposed on the substrate, a thin film encapsulation layer disposed on the substrate, and a laser blocking layer. The substrate includes a display area and a non-display area that is disposed between the display area and the hole area. The laser blocking layer is disposed on the insulating layer in the non-display area.

In an exemplary embodiment, the display apparatus further includes an insulating dam disposed on the insulating layer in the non-display area. The insulating layer is disposed in the display area and the non-display area, and the laser blocking layer is disposed on the insulating layer and the insulating dam.

In an exemplary embodiment, the insulating layer includes a plurality of insulating layers, and the laser blocking layer includes a plurality of laser blocking layers respectively disposed on different insulating layers from among the plurality of insulating layers.

In an exemplary embodiment, the laser blocking layers respectively disposed on the different insulating layers overlap each other.

In an exemplary embodiment, a first insulating layer from among the plurality of insulating layers is disposed on the substrate. A first laser blocking layer from among the plurality of laser blocking layers is disposed on the first insulating layer. A second insulating layer from among the plurality of insulating layers is disposed on the first laser blocking layer. A second laser blocking layer from among the plurality of laser blocking layers is disposed on the second insulating layer. A third insulating layer from among the plurality of insulating layers is disposed on the second laser blocking layer. An end portion of a segment of the first laser blocking layer and an end portion of a segment of the second laser blocking layer overlap each other.

In an exemplary embodiment, the insulating dam is disposed on the third insulating layer, and the insulating dam is covered by a third laser blocking layer from among the plurality of laser blocking layers.

In an exemplary embodiment, the insulating dam is disposed between adjacent segments of the first laser blocking layer or between adjacent segments of the second laser blocking layer.

In an exemplary embodiment, the display apparatus further includes an insulating auxiliary dam disposed on the insulating dam.

In an exemplary embodiment, the display apparatus further includes a first reinforcement layer disposed between the third insulating layer and the insulating dam. The insulating dam covers the first reinforcement layer.

In an exemplary embodiment, the display apparatus further includes an insulating auxiliary dam disposed on the insulating dam.

In an exemplary embodiment, the display apparatus further includes a second reinforcement layer disposed between the first reinforcement layer and the first insulating layer.

In an exemplary embodiment, the display apparatus further includes an insulating auxiliary dam disposed on the insulating dam.

In an exemplary embodiment, the laser blocking layer surrounds the display area.

In an exemplary embodiment, the thin film transistor and the light-emitting component are disposed in the display area. The thin film transistor includes a semiconductor active layer, a gate electrode, a source electrode, and a drain electrode. The light-emitting component includes a first electrode electrically connected to the thin film transistor, an intermediate layer including an organic emission layer, and a second electrode. A reinforcement layer is disposed between the insulating layer and the insulating dam. The laser blocking layer includes a first laser blocking layer and a second laser blocking layer. The insulating layer includes a plurality of insulating layers. The first laser blocking layer is disposed on a same insulating layer from among the plurality of insulating layers as the semiconductor active layer or the gate electrode. The second laser blocking layer is disposed on a same insulating layer from among the plurality of insulating layers as the first electrode. The reinforcement layer is disposed on a same insulating layer from among the plurality of insulating layers as the source electrode and the drain electrode.

In an exemplary embodiment, the laser blocking layer includes a reflector formed of a metal material.

In an exemplary embodiment, the hole area is surrounded by the display area.

In an exemplary embodiment, the hole area passes through the substrate and the thin film encapsulation layer.

In an exemplary embodiment, the display apparatus further includes a cut portion disposed in the substrate. The hole area corresponds to the cut portion.

In an exemplary embodiment, the laser blocking layer includes a first laser blocking layer and a second laser blocking layer. The first laser blocking layer is disposed on the insulating layer. The second laser blocking layer is disposed on the insulating dam. An end portion of a segment of the first laser blocking layer and an end portion of a segment of the second laser blocking layer overlap each other.

In an exemplary embodiment, the insulating dam includes a plurality of insulating dams, and the display apparatus further includes a clad layer disposed between adjacent insulating dams from among the plurality of insulating dams. The clad layer overlaps an edge of the second laser blocking layer.

According to an exemplary embodiment of the inventive concept, a display apparatus includes a substrate including a display area, a hole area, and a non-display area disposed between the display area and the hole area. The display apparatus further includes at least one hole passing through the substrate in the hole area, a thin film transistor disposed on the substrate in the display area, and a light-emitting component disposed on the substrate in the display area and electrically connected to the thin film transistor. The display apparatus further includes a first insulating layer disposed on the substrate, a first laser blocking layer disposed on the first insulating layer in the non-display area, a second insulating layer disposed on the first insulating layer and the first laser blocking layer, and a second laser blocking layer disposed on the second insulating layer in the non-display area.

In an exemplary embodiment, the display apparatus further includes a third insulating layer disposed on the second insulating layer and the second laser blocking layer, and an insulating dam disposed on the third insulating layer in the non-display area.

In an exemplary embodiment, the display apparatus further includes a third laser blocking layer disposed on the insulating dam in the non-display area.

In an exemplary embodiment, the third laser blocking layer partially overlaps the second laser blocking layer, and the second laser blocking layer partially overlaps the first laser blocking layer.

In an exemplary embodiment, the first laser blocking layer, the second laser blocking layer, and the third laser blocking layer include a reflector formed of a metal material.

BRIEF DESCRIPTION OF THE DRAWINGS

The above and other features of the present inventive concept will become apparent by describing in detail exemplary embodiments thereof with reference to the accompanying drawings, in which.

DETAILED DESCRIPTION

Figure 1:
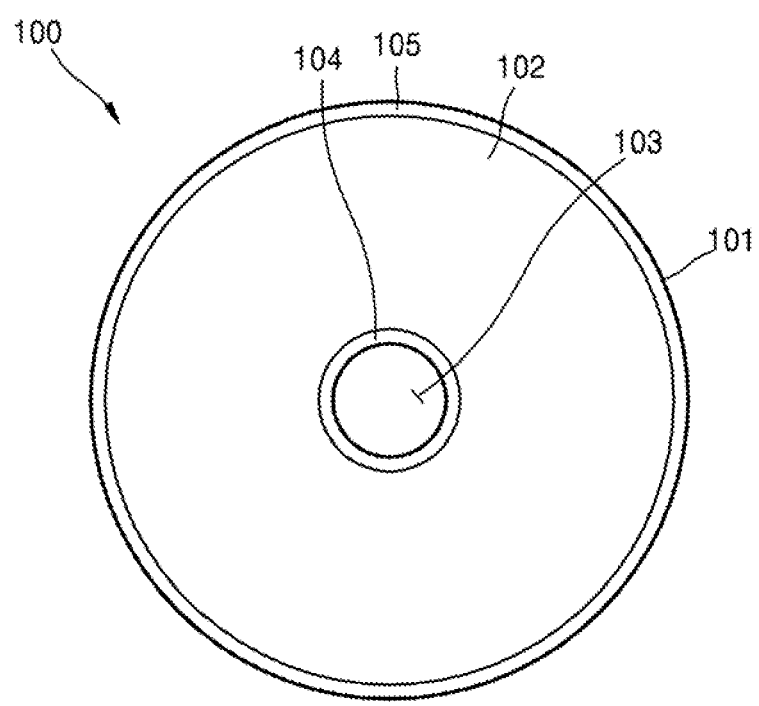
FIG. 1 is a plan view of a display apparatus according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that the terms "first", "second", "third", etc. are used herein to distinguish one element from another, and the elements are not limited by these terms. Thus, a "first" element in an exemplary embodiment may be described as a "second" element in another exemplary embodiment.

As used herein, the singular forms "a", "an", and "the" are intended to include the plural forms as well, unless the context clearly indicates otherwise.

Spatially relative terms, such as "beneath," "below," "lower," "above," "upper," etc. may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

FIG. 1 is a plan view of a display apparatus 100 according to an exemplary embodiment of the inventive concept.

Referring to FIG. 1, the display apparatus 100 may include a display substrate 101. As shown in FIG. 1, a shape of the display substrate 101 may be circular. However, exemplary embodiments are not limited thereto. A display component 102 may be disposed on the display substrate 101. The display component 102 may include a region that displays an image.

A hole 103 may be disposed at the center of the display substrate 101. The hole 103 may pass through the display substrate 101 in the thickness direction of the display substrate 101. For example, the hole 103 may fully pass through the display substrate 101. A shape of the hole 103 may be circular. However, exemplary embodiments are not limited thereto. Further, although it is illustrated in FIG. 1 that only one hole 103 is disposed at the center of the display substrate 101, exemplary embodiments are not limited thereto. For example, in exemplary embodiments, a plurality of holes 103 may be disposed in the display substrate 101. The plurality of holes 103 may be disposed in a variety of locations in the display substrate 101. Further, referring to the exemplary embodiments described herein, when the hole 103 (or another component) is described as being disposed at the center of the display substrate 101, it is to be understood that the hole 103 may be disposed exactly at the center of the display substrate 101 or near the center of the display substrate 101. In exemplary embodiments, a single hole 103 may be disposed in areas other than at the center of the display substrate 101.

A non-display area 104 may be disposed between the display component 102 and the hole 103. The non-display area 104 may surround the hole 103.

According to exemplary embodiments, the non-display area 104 is a region that is included in the display apparatus 100 that provides structural stability to the display apparatus 100 during a process of forming a plurality of devices on the display substrate 101. In exemplary embodiments, an additional non-display area 105 may further be disposed at the outermost portion of the display substrate 101. Exemplary embodiments may include both the non-display area 104 and the non-display area 105, or one of the non-display areas 104 and 105.

The display apparatus 100 may be included in a variety of electronic devices. For example, the display apparatus 100 may be included in a watch, a dashboard, a smartphone, or a tablet personal computer (PC). It is to be understood that these implementations are exemplary, and that exemplary embodiments of the inventive concept are not limited thereto.

Figure 2A:
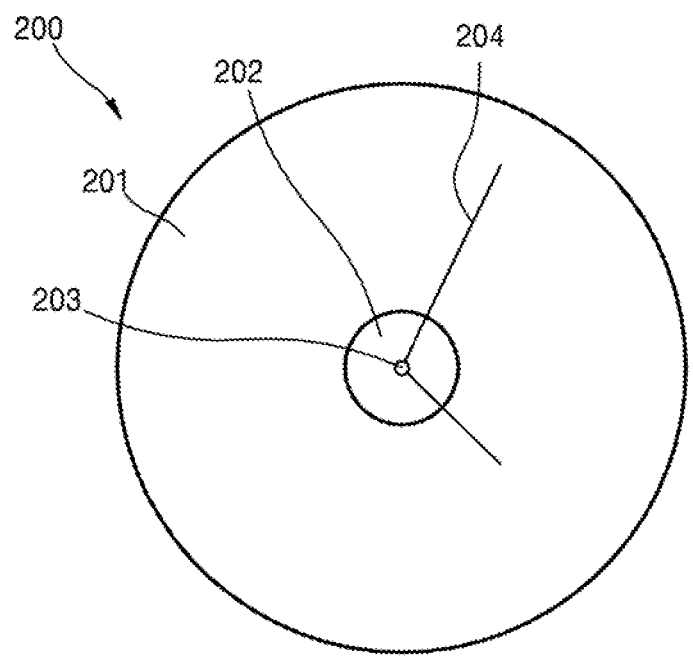
FIG. 2A is a plan view of a mechanical part combined with the display apparatus of FIG. 1 according to an exemplary embodiment of the inventive concept.
Figure 2B:
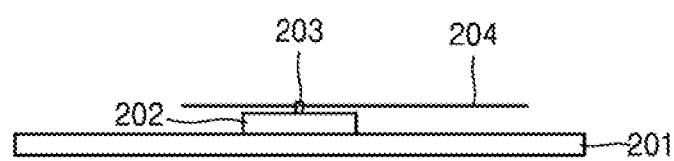
FIG. 2B is a cross-sectional view of FIG. 2A according to an exemplary embodiment of the inventive concept.

FIG. 2A is a plan view of a mechanical part 200 that may be combined with the display apparatus 100 of FIG. 1 according to exemplary embodiments of the inventive concept. FIG. 2B is a cross-sectional view of FIG. 2A according to an exemplary embodiment of the inventive concept.

Referring to FIGS. 2A and 2B, the mechanical part 200 may be a watch-type part (e.g., a mechanical watch-type part used in traditional watches).

The mechanical part 200 may include a watch body 201. A watch axis 202 may be installed at the center of the watch body 201. An arbor 203 may be installed on the watch axis 202. A clock hand 204, such as an hour hand and/or a minute hand, may be installed at the arbor 203.

Figure 3A:
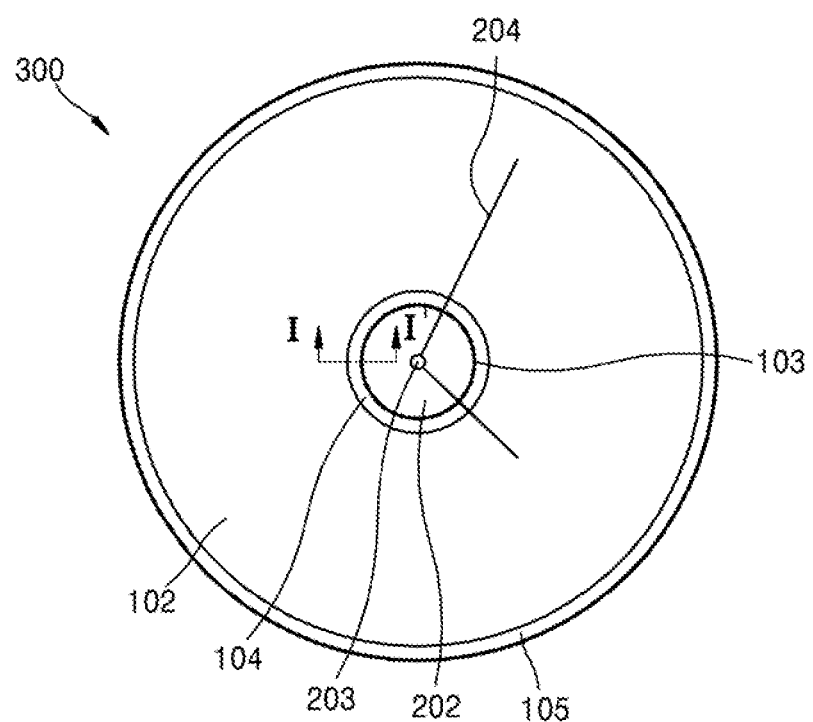
FIG. 3A is a plan view of a structure including a combination of the display apparatus of FIG. 1 and the mechanical part of FIG. 2A according to an exemplary embodiment of the inventive concept.
Figure 3B:
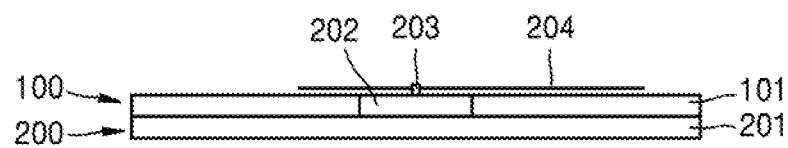
FIG. 3B is a cross-sectional view of FIG. 3A according to an exemplary embodiment of the inventive concept.

FIG. 3A is a plan view of a structure 300 including a combination of the display apparatus 100 of FIG. 1 and the mechanical part 200 of FIG. 2A according to an exemplary embodiment of the inventive concept. FIG. 3B is a cross-sectional view of FIG. 3A according to an exemplary embodiment of the inventive concept.

Referring to FIGS. 3A and 3B, the display apparatus 100 may be located at an upper side and the mechanical part 200 may be located at a lower side. That is, as shown in FIG. 3B, in exemplary embodiments, the display apparatus 100 may be disposed on top of the mechanical part 200.

As shown in FIG. 3B, the watch body 201 may be located under the display substrate 101. The bottom surface of the display substrate 101 and the top surface of the watch body 201 may contact (e.g., directly contact) each other. The watch axis 202 may be inserted through the hole 103 formed at the center of the display substrate 101. The watch axis 202 may have a size corresponding to the hole 103. The watch axis 202 may be surrounded by the non-display area 104. The clock hand 204 installed on the watch axis 202 may be located on the display substrate 101.

The structure 300 may be used to implement, for example, a watch having smartwatch functionality (e.g., by using the display apparatus 100) as well as mechanical watch functionality (e.g., by using the mechanical part 200).

Figure 4:
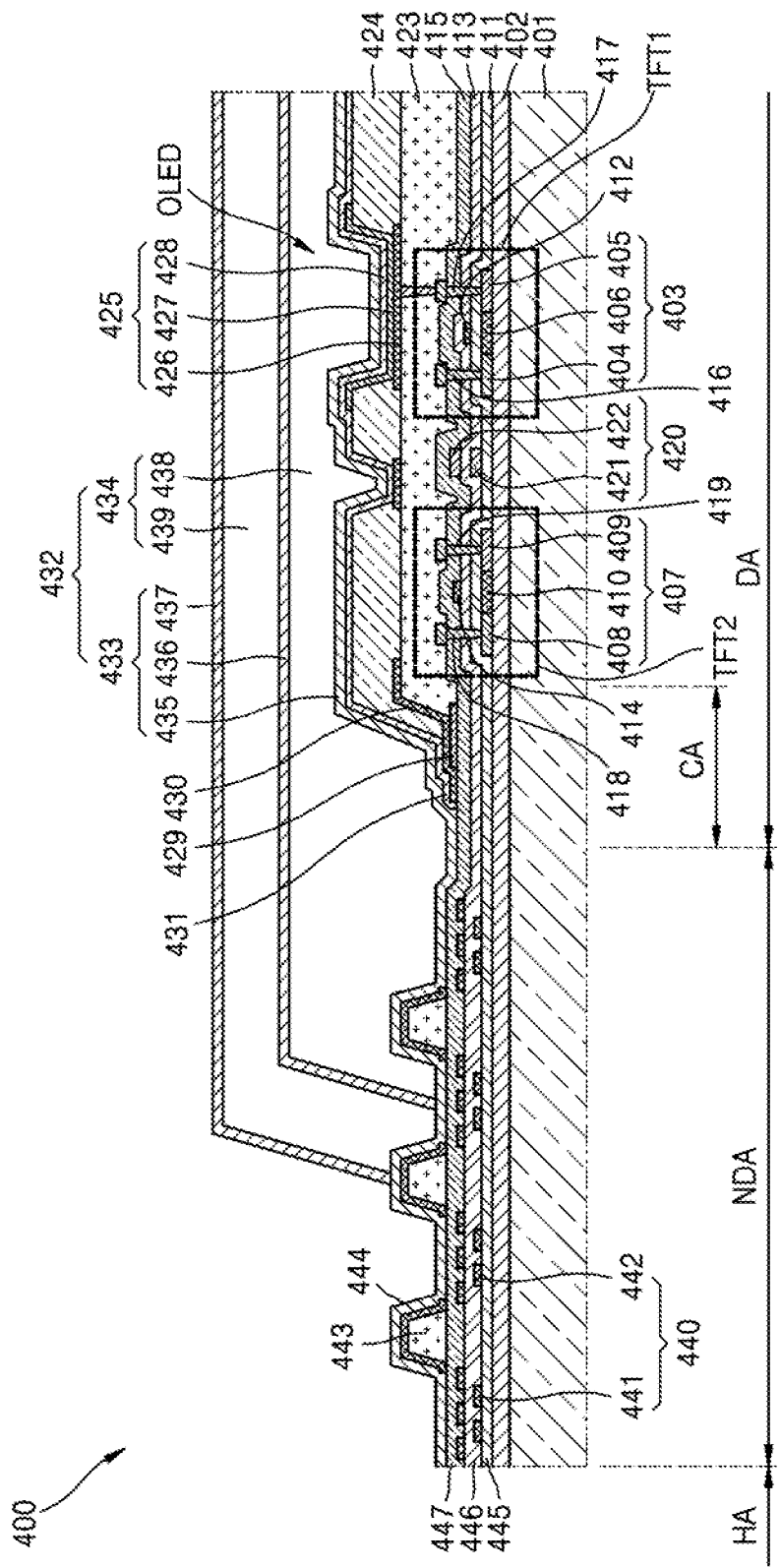
FIG. 4 is a partial enlarged cross-sectional view of a display apparatus according to an exemplary embodiment of the inventive concept.
Figure 5:
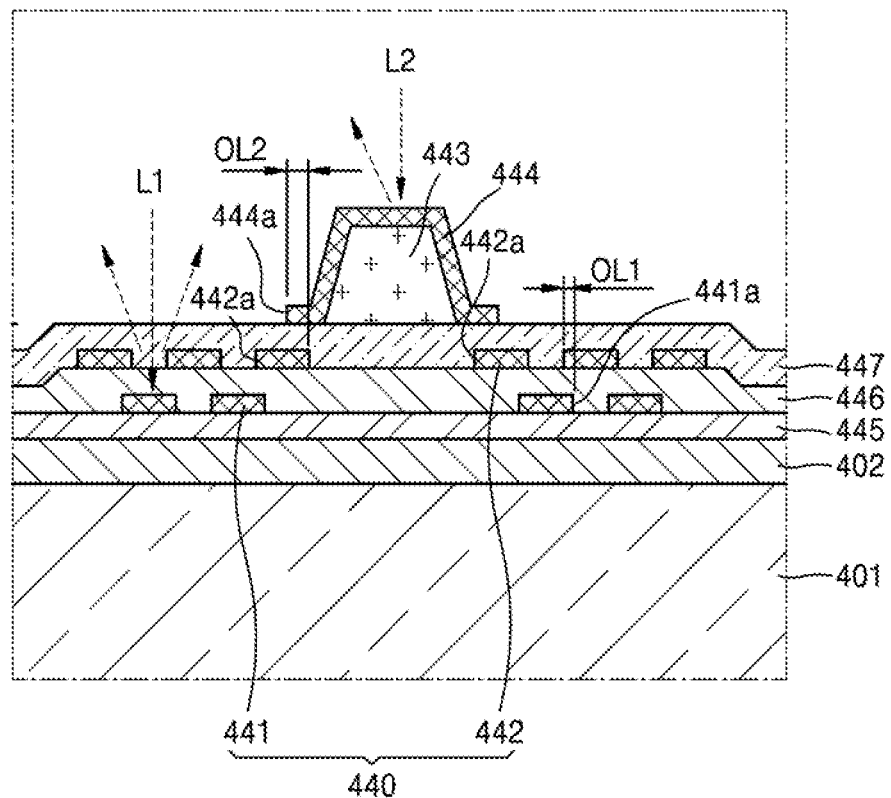
FIG. 5 is an enlarged cross-sectional view of a region in FIG. 4 in which a laser blocking layer is disposed according to an exemplary embodiment of the inventive concept.

FIG. 4 is a partial enlarged cross-sectional view of a display apparatus 400 according to an exemplary embodiment of the inventive concept. FIG. 5 is an enlarged cross-sectional view of a region in FIG. 4 in which a laser blocking layer 440 is disposed according to an exemplary embodiment of the inventive concept.

In the present exemplary embodiment, the display apparatus 400 may correspond to a portion of the structure 300 taken along line I-F of FIG. 3A.

In the exemplary embodiments described herein, the display apparatus 400 is described as including an organic light-emitting display. However, exemplary embodiments are not limited thereto. For example, in exemplary embodiments, the display apparatus 400 may include, for example, a liquid crystal display, a field emission display, or an electronic paper display.

Referring to FIGS. 4 and 5, the display apparatus 400 may include a display substrate 401 and a thin film encapsulation (TFE) layer 432 covering the display substrate 401.

The display substrate 401 may include a display area DA in which an image is displayed, and a non-display area NDA extending outside the display area DA in which an image is not displayed. The display area DA may include a circuit area CA in which circuit patterns are disposed, as described below. The non-display area NDA may surround the display area DA.

A hole area HA may be disposed outside the non-display area NDA. The hole area HA may correspond to a region in which the hole 103 of the display substrate 101 of FIG. 3A is disposed. The non-display area NDA may be disposed between the display area DA and the hole area HA.

In the present exemplary embodiment, the display area DA and the non-display area NDA may be disposed in a ring shape (e.g., a circular shape) on the display substrate 401, and the hole area HA may be disposed at the center of the display substrate 401.

The display substrate 401 may include, for example, a glass substrate, a polymer substrate, a flexible film, a metal substrate, or a composite substrate thereof. The display substrate 401 may be, for example, transparent, opaque, or translucent.

In an exemplary embodiment, the display substrate 401 may include a polymer material such as, for example, polyimide (PI), polycarbonate (PC), polyethersulphone (PES), polyethylene terephthalate (PET), polyethylene naphthalate (PEN), polyarylate (PAR), and fiberglass reinforced plastic (FRP).

A barrier layer 402 may be disposed on the display substrate 401. The barrier layer 402 may cover (e.g., entirely cover) the top surface of the display substrate 401. The barrier layer 402 may include an inorganic material or an organic material. The barrier layer 402 may include a single-layer structure or a multi-layer structure.

A plurality of thin film transistors TFTs may be disposed on the display substrate 401 in the display area DA. For example, the plurality of thin film transistors TFT may be disposed in a region in which an image is displayed and a region in which a circuit pattern is formed. Although it is illustrated in FIG. 4 that two thin film transistors TFTs are disposed on the display substrate 401, exemplary embodiments are not limited thereto.

A first thin film transistor TFT1 may include a first semiconductor active layer 403, a first gate electrode 412, a first source electrode 416, and a first drain electrode 417. The first semiconductor active layer 403 may include a source region 404 and a drain region 405 disposed by the doping of N-type dopant ions or P-type dopant ions. An undoped channel region 406 may be disposed between the source region 404 and the drain region 405. A first gate insulating layer 411 may be disposed between the first semiconductor active layer 403 and the first gate electrode 412 providing insulation therebetween.

A second thin film transistor TFT2 may include a second semiconductor active layer 407, a second gate electrode 414, a second source electrode 418, and a second drain electrode 419. The second semiconductor active layer 407 may include a source region 408, a drain region 409, and a channel region 410. The first gate insulating layer 411 and a second gate insulating layer 413 may be disposed between the second semiconductor active layer 407 and the second gate electrode 414 providing insulation therebetween. The first gate insulating layer 411 and the second gate insulating layer 413 may be stacked on one another on the display substrate 401, as shown in FIG. 4.

As shown in FIG. 4, in an exemplary embodiment, the first gate electrode 412 and the second gate electrode 414 are not disposed in the same layer. For example, the first gate electrode 412 may be disposed on the first gate insulating layer 411, and the second gate electrode 414 may be disposed on the second gate insulating layer 413. According to exemplary embodiments, even when the first thin film transistor TFT1 and the second thin film transistor TFT2 are disposed to be adjacent to each other, interference between the first gate electrode 412 and the second gate electrode 414 may be reduced, and more devices may be disposed in the same area on the display substrate 401.

The first gate insulating layer 411 and the second gate insulating layer 413 may include the same material. For example, in an exemplary embodiment, the first gate insulating layer 411 and the second gate insulating layer 413 may include an inorganic layer.

The first gate electrode 412 and the second gate electrode 414 may include the same material. For example, in an exemplary embodiment, the first gate electrode 412 and the second gate electrode 414 may include a metal material having high conductivity. For example, the first gate electrode 412 and the second gate electrode 414 may include a single-layer structure or a multi-layer structure such as, but not limited to, Au, Ag, Cu, Ni, Pt, Pd, Al, Mo, or Cr. The first gate electrode 412 and the second gate electrode 414 may include an alloy such as, for example, Al:Nd or Mo:W.

An interlayer insulating layer 415 may be disposed on the second gate electrode 414. The interlayer insulating layer 415 may include an inorganic layer or an organic layer.

The first source electrode 416 and the first drain electrode 417 may be disposed on the interlayer insulating layer 415. The first source electrode 416 and the first drain electrode 417 may be connected to the first semiconductor active layer 403 through a contact hole. Further, the second source electrode 418 and the second drain electrode 419 may be disposed on the interlayer insulating layer 415. The second source electrode 418 and the second drain electrode 419 may be connected to the second semiconductor active layer 407 through a contact hole.

The first source electrode 416, the first drain electrode 417, the second source electrode 418, and the second drain electrode 419 may include the same material. For example, in an exemplary embodiment, the first source electrode 416, the first drain electrode 417, the second source electrode 418, and the second drain electrode 419 may include, for example, a metal, an alloy, a metal nitride, a conductive metal oxide, or a transparent conductive material.

A capacitor 420 may be disposed on the display substrate 401. Exemplary embodiments may include a plurality of capacitors 420. The capacitor 420 may include a first capacitor electrode 421 and a second capacitor electrode 422. The second gate insulating layer 413 may be interposed between the first capacitor electrode 421 and the second capacitor electrode 422. The first capacitor electrode 421 may include the same material as the first gate electrode 412, and the second capacitor electrode 422 may include the same material as the second gate electrode 414.

A planarization layer 423 may cover the thin film transistors TFT1 and TFT2 and the capacitor 420. The planarization layer 423 may be disposed on the interlayer insulating layer 415. The planarization layer 423 may include an inorganic layer or an organic layer.

The first thin film transistor TFT1 may be electrically connected to an organic light-emitting device (OLED) 425, which is a light-emitting component used to display an image.

The organic light-emitting device 425 may be disposed on the planarization layer 423. The organic light-emitting device 425 may include a first electrode 426, an intermediate layer 427 including an organic emission layer, and a second electrode 428.

The first electrode 426 may function as an anode and may include various conductive materials. The first electrode 426 may include a transparent electrode or a reflective electrode. For example, when the first electrode 426 is used as a transparent electrode, the first electrode 426 may include a transparent conductive layer. When the first electrode 426 is used as a reflective electrode, the first electrode 426 may include a reflective layer and a transparent conductive layer disposed on the reflective layer.

A pixel definition layer 424 may be disposed on the planarization layer 423. The pixel definition layer 424 may cover a portion of the first electrode 426. The pixel definition layer 424 may define the emission region of each sub-pixel by surrounding the edge of the first electrode 426. The first electrode 426 may be patterned per sub-pixel.

The pixel definition layer 424 may include an organic layer or an inorganic layer. The pixel definition layer 424 may include a single-layer structure or a multi-layer structure.

The intermediate layer 427 may be disposed in a region in which the first electrode 426 is exposed by etching a portion of the pixel definition layer 424.

The intermediate layer 427 may include an organic emission layer.

In an exemplary embodiment, the intermediate layer 427 may include an organic emission layer and may further include at least one of a hole injection layer (HIL), a hole transport layer (HTL), an electron transport layer (ETL), and an electron injection layer (EIL). However, exemplary embodiments are not limited thereto. For example, in exemplary embodiments, the intermediate layer 427 may include an organic emission layer and may further include other various functional layers.

The second electrode 428 may function as a cathode. The second electrode 428 may include a transparent electrode or a reflective electrode. For example, when the second electrode 428 is used as a transparent electrode, the second electrode 428 may include a metal layer and a transparent conductive layer disposed on the metal layer. When the second electrode 428 is used as a reflective electrode, the second electrode 428 may include a metal layer.

In an exemplary embodiment, a plurality of sub-pixels may be disposed on the display substrate 401. For example, a red, green, blue, or white color may be implemented in each sub-pixel. However, exemplary embodiments are not limited thereto.

Various circuit patterns may be disposed in the circuit area CA. For example, various circuit patterns such as a power supply pattern and an anti-static pattern may be disposed in the circuit area CA.

A power line 429 may be disposed on the interlayer insulating layer 415. The power line 429 may be a line to which external power is applied. The power line 429 may include the same material as the first source electrode 416, the first drain electrode 417, the second source electrode 418, and the second drain electrode 419. In an exemplary embodiment, the power line 429 may include a three-layer structure of titanium (Ti)/aluminum (Al)/titanium (Ti).

A circuit line 430 may be disposed on the planarization layer 423. The circuit line 430 may include the same material as the first electrode 426.

The power line 429 and the circuit line 430 may be disposed in different layers. One end of the circuit line 430 may contact the power line 429. In an exemplary embodiment, at least a portion of the circuit line 430 may overlap the power line 429. The circuit line 430 may be connected to a portion extending from a second electrode 431.

In the display apparatus 400, the thin film encapsulation layer 432 of a multi-layer structure may be disposed on the display substrate 401. The thin film encapsulation layer 432 may prevent external moisture from penetrating into the display area DA.

The thin film encapsulation layer 432 may cover the display substrate 401. The thin film encapsulation layer 432 may cover the entire region of the display area DA. The thin film encapsulation layer 432 may further cover at least a portion of the non-display area NDA.

A plurality of inorganic layers 433 and a plurality of organic layers 434 may be alternately stacked in the thin film encapsulation layer 432. The inorganic layer 433 may include, for example, a first inorganic layer 435, a second inorganic layer 436, and a third inorganic layer 437. The organic layer 434 may include, for example, a first organic layer 438 and a second organic layer 439.

In the process of forming the organic layer 434 on the display substrate 401, at least one insulating dam 443 may be disposed in the non-display area NDA. The at least one insulating dam 443 may prevent a liquid raw material of the organic layer 434 from overflowing into an undesired region of the display substrate 401.

In an exemplary embodiment, a plurality of insulating dams 443 may surround the display area DA. The insulating dams 443 may be disposed to be spaced apart from one another by a predetermined distance. The insulating dam 443 may include a single-layer structure or a multi-layer structure. The insulating dam 443 may be disposed in the same layer as the planarization layer 423. The insulating dam 443 may be formed in the same process as the planarization layer 423. In an exemplary embodiment, the insulating dam 443 may be disposed in the same layer as another insulating layer such as, for example, the pixel definition layer 424.

In the process of manufacturing the display apparatus 400, a portion of the intermediate layer 427 included in the organic light-emitting device 425 (e.g., the hole injection layer (HIL), the hole transport layer (HTL), the electron transport layer (ETL), or the electron injection layer (EIL)) or the second electrode 428 may be deposited on the entire surface, including the non-display area NDA, according to the features of a deposition mask.

In exemplary embodiments, a portion of the intermediate layer 427 or the second electrode 428 formed in the non-display area NDA may be removed before the forming of the thin film encapsulation layer 432. After the removal, the thin film encapsulation layer 432 may be formed on the display substrate 401.

In an exemplary scenario, a portion of the intermediate layer 427 or the second electrode 428 may be removed using a laser apparatus. For example, a laser ablation process may be performed to remove a portion of the intermediate layer 427 or the second electrode 428 formed in the non-display area NDA. However, during the laser ablation process, a laser beam may adversely affect the display substrate 401 and the insulating layer disposed on the display substrate 401, particularly the insulating layer including an organic layer.

Thus, in exemplary embodiments of the inventive concept, a plurality of laser blocking layers 440 are disposed in the non-display area NDA to protect the display substrate 401 and the insulating layer formed on the display substrate 401 from the laser beam during the laser ablation process.

In the non-display area NDA, a barrier layer 402 may be disposed on the display substrate 401. A first insulating layer 445 may be disposed on the barrier layer 402. The first insulating layer 445 may be disposed in the same layer as the first gate insulating layer 411. The first insulating layer 445 may be formed in the same process as the first gate insulating layer 411. The first insulating layer 445 may include the same material as the first gate insulating layer 411.

A first laser blocking layer 441 may be disposed on the first insulating layer 445. In exemplary embodiments, the first laser blocking layer 441 may be directly disposed on, and directly contact the first insulating layer 445. The first laser blocking layer 441 may be disposed to include segments spaced apart from one another, as shown in FIGS. 4 and 5. The first laser blocking layer 441 may surround the display area DA. The first laser blocking layer 441 may be disposed in the same layer as the first gate electrode 412. The first laser blocking layer 441 may be formed in the same process as the first gate electrode 412. The first laser blocking layer 441 may include the same material as the first gate electrode 412.

A second insulating layer 446 may be disposed on the first laser blocking layer 441 and may cover the first laser blocking layer 441. In exemplary embodiments, the second insulating layer 446 may be directly disposed on, and directly contact the first insulating layer 445 and the first laser blocking layer 441. The second insulating layer 446 may be disposed in the same layer as the second gate insulating layer 413. The second insulating layer 446 may be formed in the same process as the second gate insulating layer 413. The second insulating layer 446 may include the same material as the second gate insulating layer 413.

A second laser blocking layer 442 may be disposed on the second insulating layer 446. In exemplary embodiments, the second laser blocking layer 442 may be directly disposed on, and directly contact the second insulating layer 446. The second laser blocking layer 442 may be disposed to include segments spaced apart from one another, as shown in FIGS. 4 and 5. The second laser blocking layer 442 may surround the display area DA. The second laser blocking layer 442 may be disposed in the same layer as the second gate electrode 414. The second laser blocking layer 442 may be formed in the same process as the second gate electrode 414. The second laser blocking layer 442 may include the same material as the second gate electrode 414.

A third insulating layer 447 may be disposed on the second laser blocking layer 442. In exemplary embodiments, the third insulating layer 447 may be directly disposed on, and directly contact the second insulating layer 446 and the second laser blocking layer 442. The third insulating layer 447 may cover the second laser blocking layer 442. The third insulating layer 447 may be disposed in the same layer as the interlayer insulating layer 415. The third insulating layer 447 may be formed in the same process as the interlayer insulating layer 415. The third insulating layer 447 may include the same material as the interlayer insulating layer 415.

In an exemplary embodiment, the first laser blocking layer 441 and the second laser blocking layer 442 may include a reflective material. The reflective material may prevent the display substrate 401 from being damaged by the laser beam during the laser ablation process. For example, the first laser blocking layer 441 and the second laser blocking layer 442 may include a thin reflector formed of a metal material.

In an exemplary embodiment, the first laser blocking layer 441 and the second laser blocking layer 442 are not electrically connected to the display area DA. In an exemplary embodiment, a predetermined power is not applied to the first laser blocking layer 441 and the second laser blocking layer 442.

Segments of the first laser blocking layer 441 and the second laser blocking layer 442 may overlap one another, as shown in FIGS. 4 and 5.

For example, as shown in FIG. 5, the segments of the first laser blocking layer 441 may be disposed to be spaced apart from one another on the first insulating layer 445. The segments of the second laser blocking layer 442 may be disposed to be spaced apart from one another on the second insulating layer 446. The segments of the first laser blocking layer 441 and the second laser blocking layer 442 may be disposed to overlap one another at least partially. That is, as shown in FIG. 5, the segments of the second laser blocking layer 442 may be disposed above and overlap (e.g., partially overlap) the segments of the first laser blocking layer 441. In an exemplary embodiment, a first overlap portion OL1 may be disposed between one end portion 441a of a segment of the first laser blocking layer 441 and one end portion 442a of a segment of the second laser blocking layer 442 opposite thereto, as shown in FIG. 5.

Thus, according to exemplary embodiments, during the laser ablation process, even when a laser beam L1 is irradiated onto the display substrate 401, the laser beam may not penetrate into the display substrate 401 as a result of being reflected by the first laser blocking layer 441 and the second laser blocking layer 442, which overlap each other, as indicated by the arrows shown in FIG. 5.

In an exemplary embodiment, the insulating dam 443 may be disposed between some of the segments of the second laser blocking layer 442. As shown in FIG. 5, the insulating dam 443 may be disposed in a different layer than the second laser blocking layer 442 (e.g., in a layer above the second laser blocking layer 442). For example, the insulating dam 442 may be disposed above the second laser blocking layer 442, and may be aligned with the second laser blocking layer 442 such that it is disposed between adjacent segments of the laser blocking layer 442. Similarly, in an exemplary embodiment, the insulating dam 443 may be disposed between some of the segments of the first laser blocking layer 441. For example, the insulating dam 443 may be disposed above the first laser blocking layer 441, and may be aligned with the first laser blocking layer 441 such that it is disposed between adjacent segments of the first laser blocking layer 441, as shown in FIG. 5. For example, as shown in FIG. 5, in an exemplary embodiment, a first space is disposed between adjacent segments of the first laser blocking layer 441 and a second space is disposed between adjacent segments of the second laser blocking layer 442. The insulating dam 442 may be disposed on the third insulating layer 447 above the first laser blocking layer 441 and the second laser blocking layer 442 such that end portions of the insulating dam 442, which extend downward from an upper portion of the insulating dam 442 and contact the third insulating layer 447, are aligned to be within the first and/or second spaces, as shown in FIG. 5 (e.g., in an exemplary embodiment, the insulating dam 443 does not overlap segments of the first laser blocking layer 441 and/or the second laser blocking layer 442).

It is to be understood that the location of the insulating dam 443 with relation to the first and second laser blocking layers 441 and 442 is not limited to the exemplary embodiments described above.

In an exemplary scenario, during the laser ablation process, the laser beam generated by the laser apparatus may adversely affect the plurality of insulating dams 443. For example, when a laser beam L2 hits an insulating dam 443, the insulating dam 443 may be damaged.

Thus, according to exemplary embodiments, a third laser blocking layer 444 may be disposed on the insulating dam 443 (e.g., on the outer surface of the insulating dam 443), as shown in FIG. 5. The third laser blocking layer 444 may be formed in the same process as the first electrode 426. The third laser blocking layer 444 may include the same material as the first electrode 426.

The third laser blocking layer 444 may be disposed to overlap at least a portion of the first laser blocking layer 441 or at least a portion of the second laser blocking layer, as shown in FIG. 5. In the present exemplary embodiment, a second overlap portion OL2 may be disposed between one end portion 444a of the third laser blocking layer 444 and one end portion 442a of a segment of the second laser blocking layer 442 opposite thereto. Thus, during the laser ablation process, even when the laser beam L2 is irradiated onto the insulating dam 443, the laser beam L2 may be reflected by the third laser blocking layer 444, preventing the insulating dam 443 from being damaged.

As shown in FIG. 5, in exemplary embodiments, the third laser blocking layer 444 may partially overlap the second laser blocking layer 442 (e.g., a portion of the third laser blocking layer 444 may partially overlap at least one segment of the second laser blocking layer 442), and the second laser blocking layer 442 may partially overlap the first laser blocking layer 441 (e.g., at least one segment of the second laser blocking layer 442 may partially overlap at least one segment of the first laser blocking layer 441).

FIGS. 6 to 11 are cross-sectional views illustrating the disposition of a laser blocking layer according to exemplary embodiments of the inventive concept.

Hereinafter, it is to be understood that components previously described and referred to again have the same structure and perform the same functions as previously described. Thus, for convenience of explanation, a further description of such components may be omitted herein.

Figure 6:
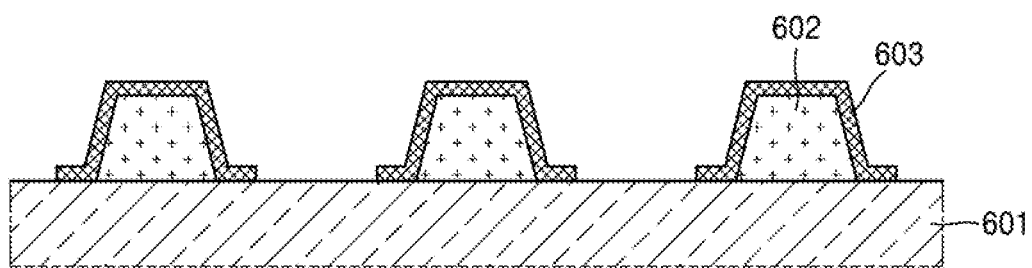
FIGS. 6 to 11 are cross-sectional views illustrating the disposition of a laser blocking layer according to exemplary embodiments of the inventive concept.

Referring to FIG. 6, a plurality of insulating dams 602 may be disposed on an insulating layer 601. The insulating dams 602 may be disposed to be spaced apart from one another by a predetermined distance. A laser blocking layer 603 may be disposed on each insulating dam 602 (e.g., on the outer surface of each insulating dam 602). In exemplary embodiments, the first laser blocking layer 441 or the second laser blocking layer 442 of FIG. 5 may be disposed in the insulating layer 601.

Figure 7:
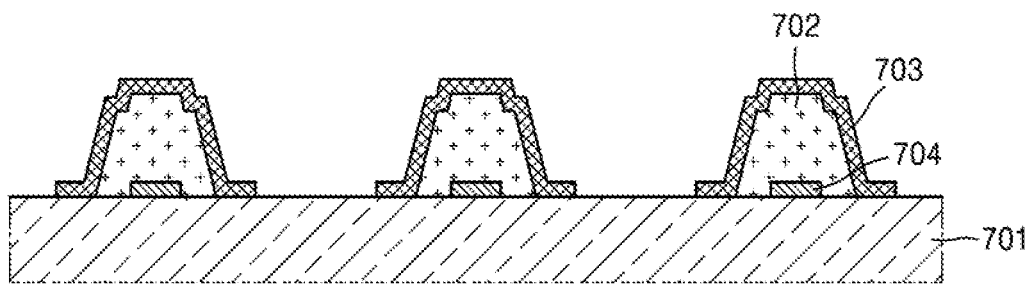

Referring to FIG. 7, a plurality of insulating dams 702 may be disposed on an insulating layer 701. The insulating dams 702 may be disposed to be spaced apart from one another by a predetermined distance. A laser blocking layer 703 may be disposed on the insulating dam 702 (e.g., on the outer surface of the insulating dam 702).

A reinforcement layer 704 may be disposed between the insulating layer 701 and the insulating dam 702. The reinforcement layer 704 may be formed of the same material and in the same process as the first source electrode 416, the first drain electrode 417, the second source electrode 418, and the second drain electrode 419 of FIG. 4. Reinforcement layers of other exemplary embodiments described below may also be similarly applied thereto.

The insulating dam 702 may cover the reinforcement layer 704. Due to the presence of the reinforcement layer 704, the height of the insulating dam 702 may be further increased by the thickness of the reinforcement layer 704. In exemplary embodiments, the first laser blocking layer 441 or the second laser blocking layer 442 of FIG. 5 may be disposed in the insulating layer 701.

Figure 8:
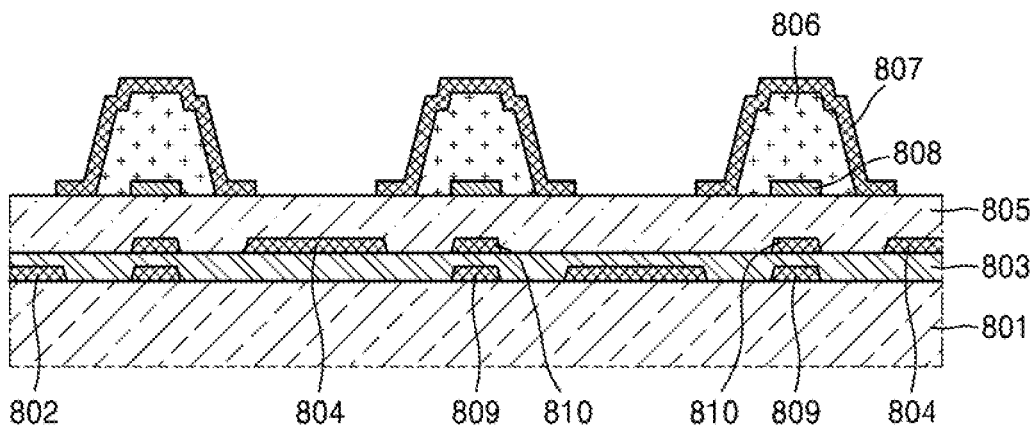

Referring to FIG. 8, a first laser blocking layer 802 may be disposed on a first insulating layer 801. A second insulating layer 803 may cover the first laser blocking layer 802. A second laser blocking layer 804 may be disposed on the second insulating layer 803. A third insulating layer 805 may cover the second laser blocking layer 804.

An insulating dam 806 may be disposed on the third insulating layer 805. A third laser blocking layer 807 may be disposed on the insulating dam 806 (e.g., on the outer surface of the insulating dam 806). A reinforcement layer 808 may be disposed between the third insulating layer 805 and the insulating dam 806. The insulating dam 806 may cover the reinforcement layer 808. At least one reinforcement layer 809 or 810 may be further disposed under the insulating dam 806 and over the first insulating layer 801 or the second insulating layer.

Figure 9:
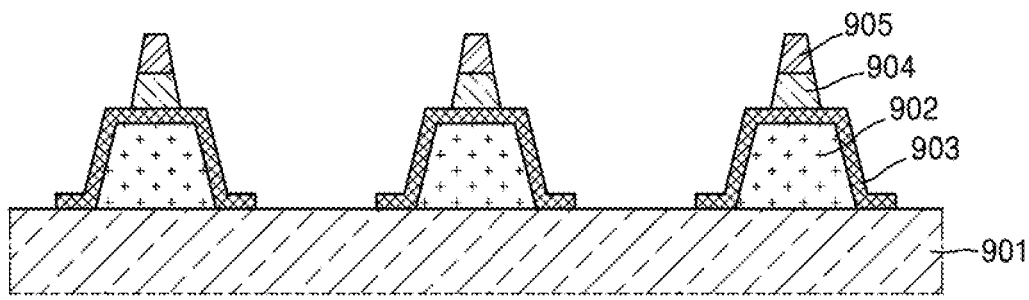

Referring to FIG. 9, a plurality of insulating dams 902 may be disposed on an insulating layer 901. A laser blocking layer 903 may be disposed on the insulating dams 902 (e.g., on the outer surface of the insulating dams 902).

At least one layer of insulating auxiliary dams may be further disposed over the insulating dam 902. For example, a first insulating auxiliary dam 904 may be disposed on the laser blocking layer 903, and a second insulating auxiliary dam 905 may be disposed on the first insulating auxiliary dam 904. The total height of the insulating dam 902 may be further increased due to the presence of the first insulating auxiliary dam 904 and the second insulating auxiliary dam 905. Exemplary embodiments may include both the first and second insulating auxiliary dams 904 and 905, or one of the first and second insulating auxiliary dams 904 and 905.

The first insulating auxiliary dam 904 may be disposed on the same insulating layer as the pixel definition layer 424 of FIG. 4. The second insulating auxiliary dam 905 may be formed in the same process as a spacer that may be formed around the sub-pixel of FIG. 4. First and second insulating auxiliary dams of other exemplary embodiments described below may also be similarly applied thereto. In exemplary embodiments, the first laser blocking layer 441 and the second laser blocking layer 442 of FIG. 5 may be disposed in the insulating layer 901.

Figure 10:
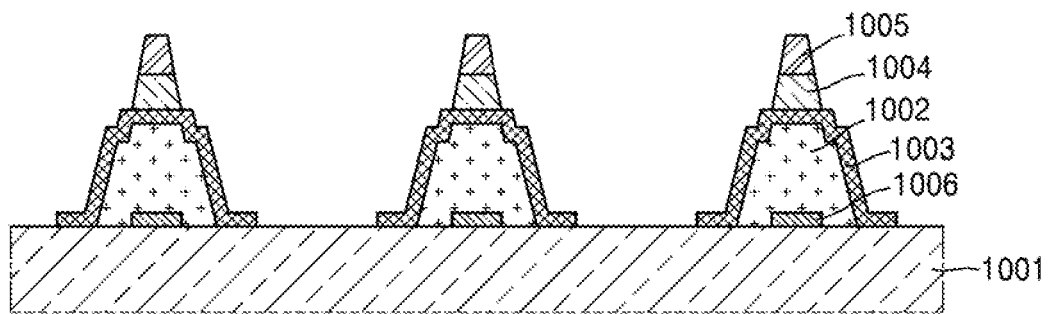

Referring to FIG. 10, a plurality of insulating dams 1002 may be disposed on an insulating layer 1001. A laser blocking layer 1003 may be disposed on the insulating dam 1002 (e.g., on the outer surface of the insulating dam 1002).

A reinforcement layer 1006 may be disposed between the insulating layer 1001 and the insulating dam 1002. The insulating dam 1002 may cover the reinforcement layer 1006.

A first insulating auxiliary dam 1004 may be disposed on the laser blocking layer 1003, and a second insulating auxiliary dam 1005 may be disposed on the first insulating auxiliary dam 1004. In exemplary embodiments, the first laser blocking layer 441 and the second laser blocking layer 442 of FIG. 5 may be disposed in the insulating layer 1001.

Figure 11:
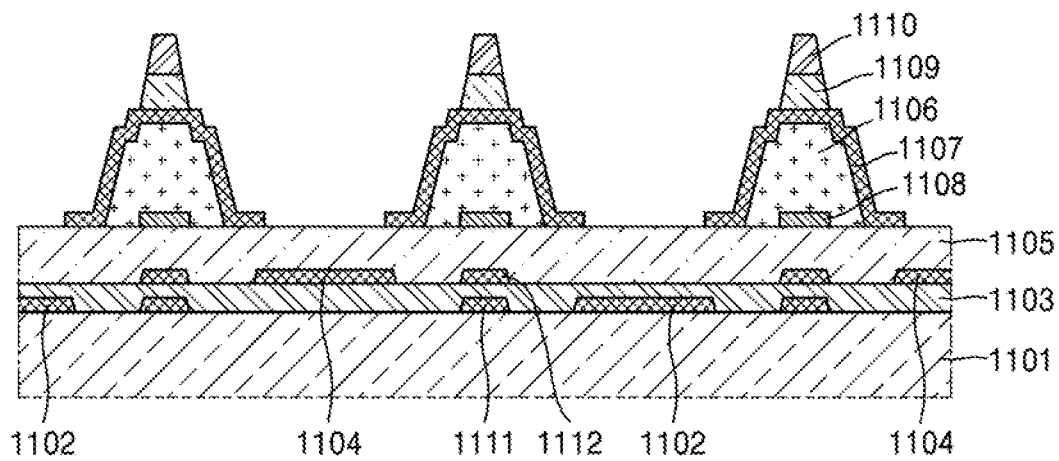

Referring to FIG. 11, a first laser blocking layer 1102 may be disposed on a first insulating layer 1101. A second insulating layer 1103 may cover the first laser blocking layer 1102. A second laser blocking layer 1104 may be disposed on the second insulating layer 1103. A third insulating layer 1105 may cover the second laser blocking layer 1104.

An insulating dam 1106 may be disposed on the third insulating layer 1105. A third laser blocking layer 1107 may be disposed on the insulating dam 1106 (e.g., on the outer surface of the insulating dam 1106). A reinforcement layer 1108 may be disposed between the third insulating layer 1105 and the insulating dam 1106. The insulating dam 1106 may cover the reinforcement layer 1108.

A first insulating auxiliary dam 1109 may be disposed on the third laser blocking layer 1107, and a second insulating auxiliary dam 1110 may be disposed on the first insulating auxiliary dam 1109.

At least one reinforcement layer 1111 or 1112 may be further disposed under the insulating dam 1106 and over the first insulating layer 1101 or the second insulating layer 1103.

Figure 12:
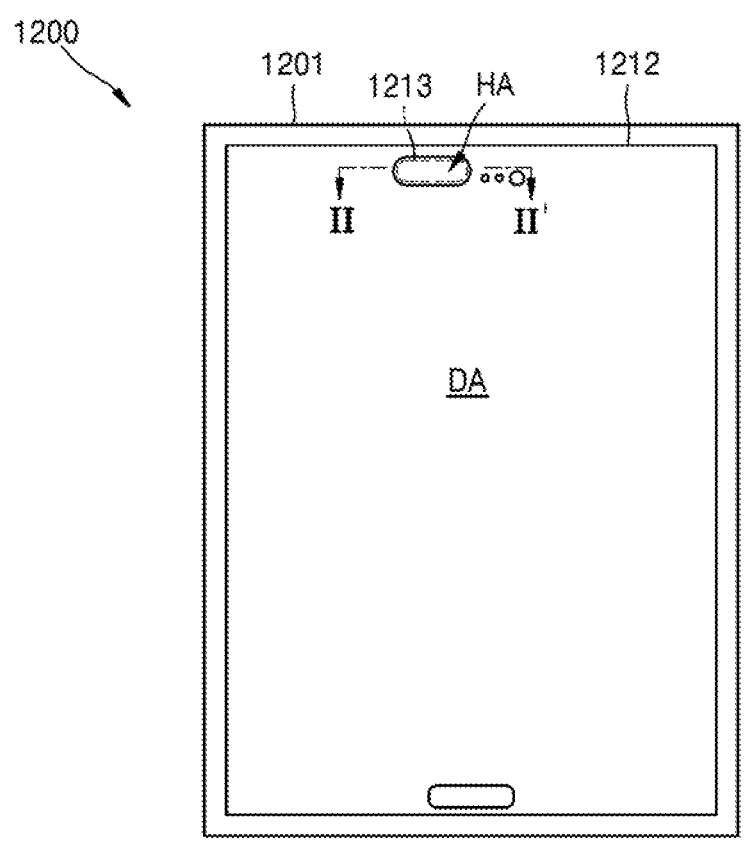
FIG. 12 is a plan view of a display apparatus according to an exemplary embodiment of the inventive concept.
Figure 13:
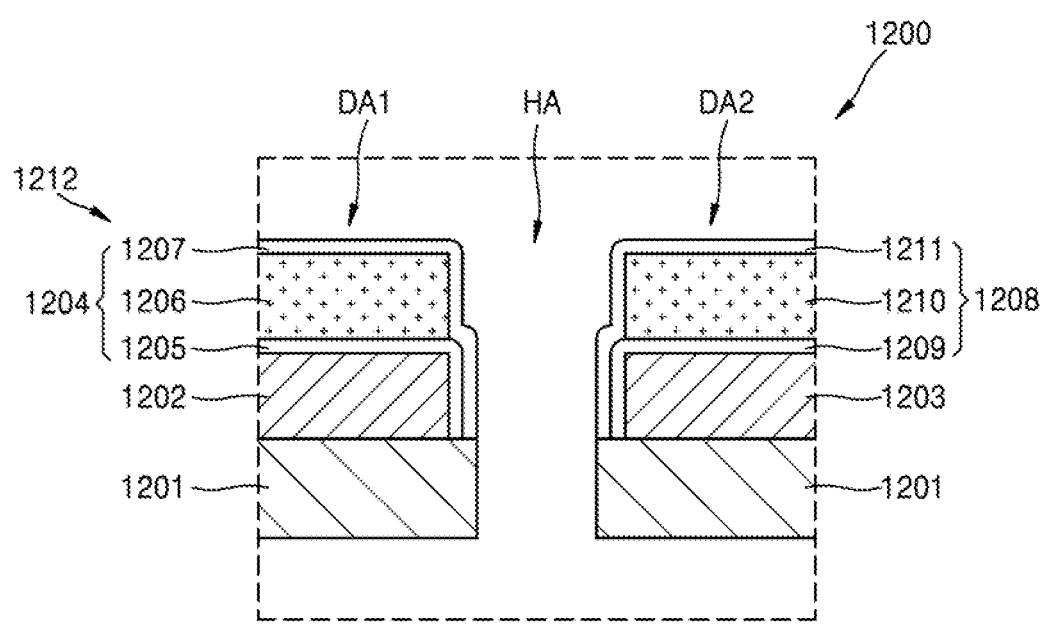
FIG. 13 is a cross-sectional view taken along line II-IT of FIG. 12 according to an exemplary embodiment of the inventive concept.

FIG. 12 is a plan view of a display apparatus 1200 according to an exemplary embodiment of the inventive concept. FIG. 13 is a cross-sectional view taken along line II-IT of FIG. 12 according to an exemplary embodiment of the inventive concept.

The display apparatus 1200 may be utilized in a variety of electronic devices. For example, the display apparatus 1200 maybe utilized in a dashboard, a smartphone, a tablet personal computer (PC), etc.

In the present exemplary embodiment, a portion in which a hole area HA corresponding to the hole area HA of FIG. 4 is disposed will be primarily described, and the display apparatus 1200 may include the laser blocking layer of FIG. 4.

Referring to FIGS. 12 and 13, a display area DA may be disposed on a display substrate 1201. A hole area HA may be disposed in the display area DA. The hole area HA may be disposed in the display area DA and may be surrounded by the display area DA. In an exemplary embodiment, a non-display area may be disposed between the display area DA and the hole area HA.

The display apparatus 1200 may include a first display area DA1, a second display area DA2, and the hole area HA. The hole area HA may be disposed between the first display area DA1 and the second display area DA2.

The display apparatus 1200 may include the display substrate 1201. The first display area DA1 and the second display area DA2 may be disposed on the display substrate 1201. In an exemplary embodiment, the first display area DA1 and the second display area DA2 may be connected to each other.

The display apparatus 1200 may include the display substrate 1201, at least one display component 1202 or 1203 disposed on the display substrate 1201, and a thin film encapsulation (TFE) layer 1212 covering the display component 1202 or 1203.

A first display component 1202 may be disposed on the first display area DA1. A first thin film encapsulation layer 1204 may be disposed on the first display component 1202. The first thin film encapsulation layer 1204 may include a first inorganic layer 1205, a first organic layer 1206 disposed on the first inorganic layer 1205, and a second inorganic layer 1207 disposed on the first organic layer 1206.

A second display component 1203 may be disposed on the second display area DA2. A second thin film encapsulation layer 1208 may be disposed on the second display component 1203. The second thin film encapsulation layer 1208 may include a first inorganic layer 1209, a first organic layer 1210 disposed on the first inorganic layer 1209, and a second inorganic layer 1211 disposed on the first organic layer 1210.

In an exemplary embodiment, the first display component 1202 and the second display component 1203 may be connected to each other.

In an exemplary embodiment, the first thin film encapsulation layer 1204 and the second thin film encapsulation layer 1208 may be connected to each other. The thin film encapsulation layer 1212 may collectively refer to the first thin film encapsulation layer 1204 and the second thin film encapsulation layer 1208.

The hole area HA may be formed to pass through the display substrate 1201 and the thin film encapsulation layer 1212. The hole area HA may be surrounded by the first display area DA1 and the second display area DA2. Thus, the hole area HA may be disposed in the display area DA including the first display area DA1 and the second display area DA2.

In an exemplary embodiment, an electronic part 1213 may be disposed in the hole area HA. For example, an electronic part 1213 including a compact camera, a speaker, a sensor such as an illumination sensor, or a button such as a home button may be disposed in the hole area HA. It is to be understood that these components are exemplary, and that the electronic part 1213 is not limited thereto.

In an exemplary embodiment, a touch screen, a polarizer, or a cover window may be disposed over the hole area HA.

In an exemplary embodiment, a cut portion formed by cutting at least a partial region may be disposed in the display apparatus 1200. The cut portion may correspond to a portion formed by cutting a partial region of the top portion or the bottom portion of the display apparatus 1200.

By the cut portion, a hole area HA may be disposed in the top portion or the bottom portion of the display apparatus 1200. However, the location of the hole area HA is not limited thereto. The hole area HA may correspond to a region cut by the cut portion. The hole area HA may be formed to pass through the display substrate 1201 and the thin film encapsulation layer 1212 as illustrated in FIGS. 12 and 13.

The hole area HA may be disposed in the display area DA, and at least a portion thereof may be surrounded by the display area DA. In an exemplary embodiment, an electronic part such as, for example, a compact camera, a speaker, a sensor, or a button may be disposed in the hole area HA. It is to be understood that these components are exemplary, and that the electronic part is not limited thereto.

In an exemplary embodiment, a touch screen, a polarizer, or a cover window may be disposed over the hole area HA.

FIGS. 14 to 20 are cross-sectional views illustrating the disposition of a laser blocking layer according to an exemplary embodiment of the inventive concept.

Hereinafter, it is to be understood that components previously described and referred to again have the same structure and perform the same functions as previously described. Thus, for convenience of explanation, a further description of such components may be omitted herein.

Figure 14:
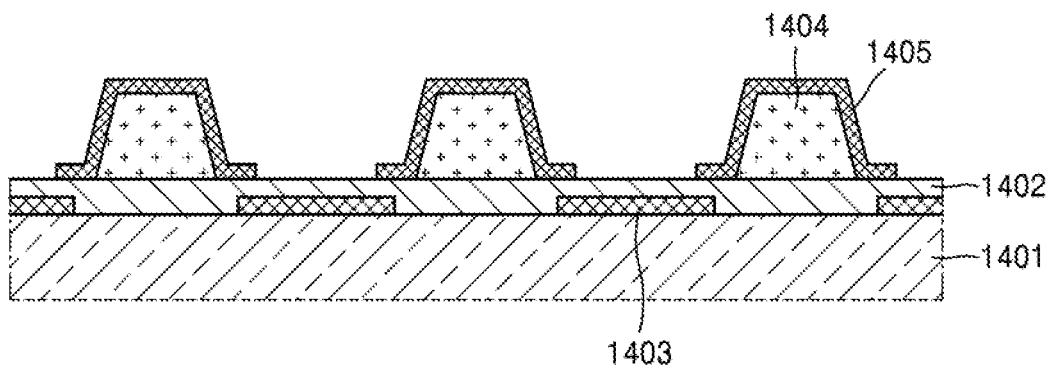
FIGS. 14 to 20 are cross-sectional views illustrating the disposition of a laser blocking layer according to an exemplary embodiment of the inventive concept.

Referring to FIG. 14, a first laser blocking layer 1403 may be disposed on a first insulating layer 1401. In an exemplary embodiment, the first laser blocking layer 1403 may be formed of the same material and in the same process as any one of the semiconductor active layer 403 or 407, the first gate electrode 412, and the second gate electrode 414 of FIG. 4.

A second insulating layer 1402 may cover the first laser blocking layer 1403. A plurality of insulating dams 1404 may be disposed on the second insulating layer 1402. The insulating dams 1404 may be disposed to be spaced apart from one another by a predetermined distance. A second laser blocking layer 1405 may be disposed on the insulating dam 1404 (e.g., on the outer surface of the insulating dam 1404).

Figure 15:
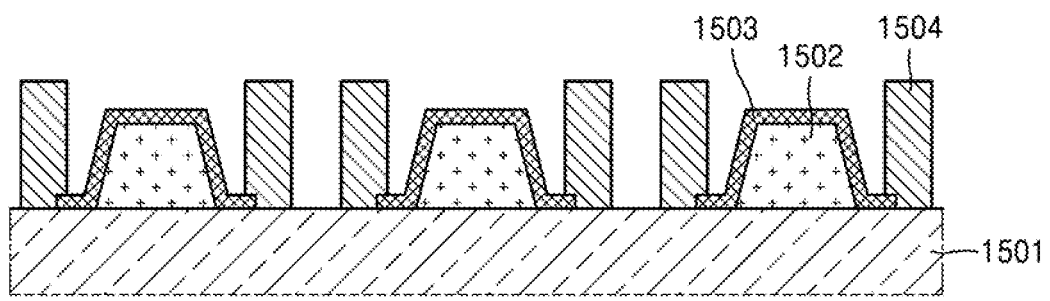

Referring to FIG. 15, a plurality of insulating dams 1502 may be disposed on an insulating layer 1501. The insulating dams 1502 may be disposed to be spaced apart from one another by a predetermined distance. A laser blocking layer 1503 may be disposed on the insulating dam 1502 (e.g., on the outer surface of the insulating dam 1502).

In an exemplary embodiment, a clad layer 1504 may be disposed between adjacent insulating dams 1502. The clad layer 1504 may overlap the edge of the laser blocking layer 1503. The clad layer 1504 may protect the edge of the laser blocking layer 1503.

In an exemplary embodiment, the clad layer 1504 may be formed of the same material and in the same process as the pixel definition layer 424 of FIG. 4.

Figure 16:
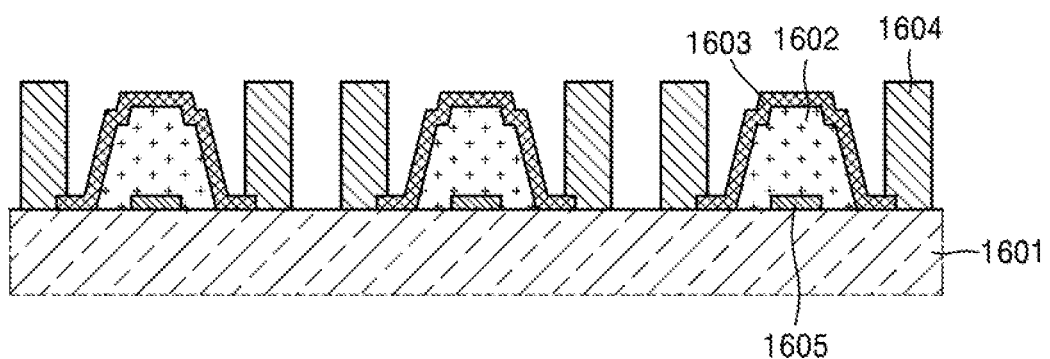

Referring to FIG. 16, a plurality of insulating dams 1602 may be disposed on an insulating layer 1601. A reinforcement layer 1605 may be disposed between the insulating layer 1601 and the insulating dams 1602. The reinforcement layer 1605 may be formed of the same material and in the same process as the first source electrode 416, the first drain electrode 417, the second source electrode 418, and the second drain electrode 419 of FIG. 4. Reinforcement layers of other exemplary embodiments described below may also be similarly applied thereto.

The insulating dam 1602 may cover the reinforcement layer 1605. Due to the presence of the reinforcement layer 1605, the height of the insulating dam 1602 may be further increased by the thickness of the reinforcement layer 1605.

In an exemplary embodiment, a clad layer 1604 may be disposed between adjacent insulating dams 1602. The clad layer 1604 may overlap the edge of a laser blocking layer 1603.

Figure 17:
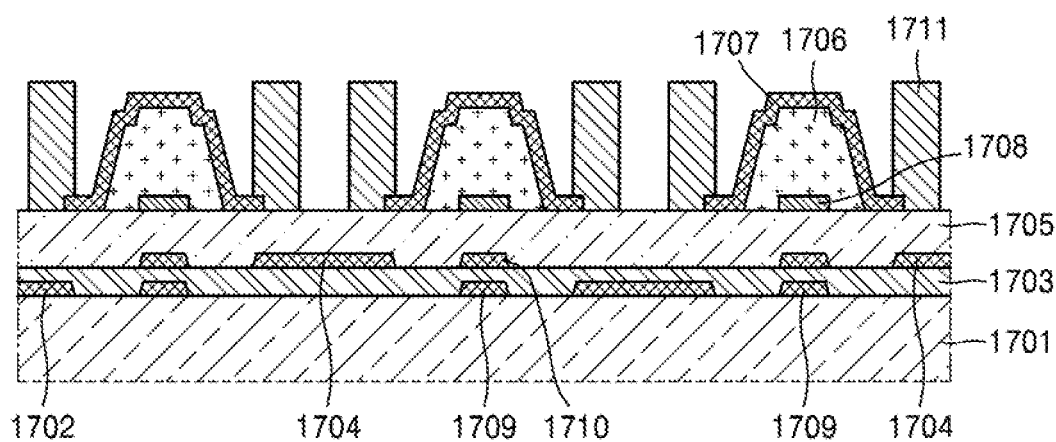

Referring to FIG. 17, a first laser blocking layer 1702 may be disposed on a first insulating layer 1701. A second insulating layer 1703 may cover the first laser blocking layer 1702. A second laser blocking layer 1704 may be disposed on the second insulating layer 1703. A third insulating layer 1705 may cover the second laser blocking layer 1704.

An insulating dam 1706 may be disposed on the third insulating layer 1705. A third laser blocking layer 1707 may be disposed on the insulating dam 1706 (e.g., on the outer surface of the insulating dam 1706). A reinforcement layer 1708 may be disposed between the third insulating layer 1705 and the insulating dam 1706. The insulating dam 1706 may cover the reinforcement layer 1708.

At least one reinforcement layer 1709 or 1710 may be further disposed under the insulating dam 1706 and over the first insulating layer 1701 or the second insulating layer 1703.

In an exemplary embodiment, a clad layer 1711 may be disposed between adjacent insulating dams 1706. The clad layer 1711 may overlap the edge of the third laser blocking layer 1707.

Figure 18:
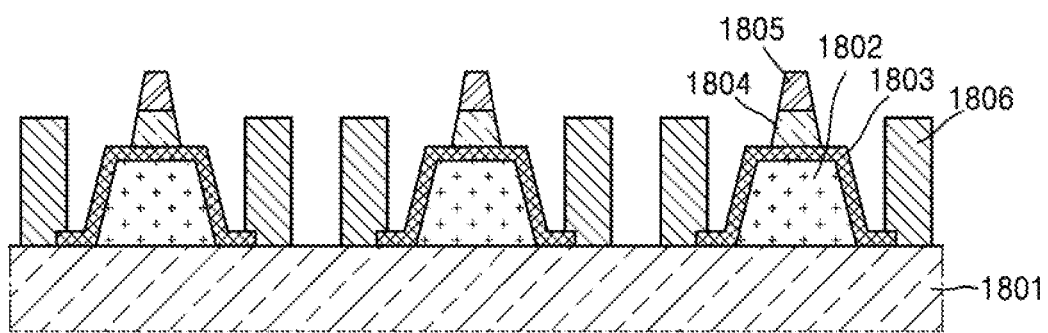

Referring to FIG. 18, a plurality of insulating dams 1802 may be disposed on an insulating layer 1801. A laser blocking layer 1803 may be disposed on the insulating dams 1802 (e.g., on the outer surface of the insulating dams 1802).

At least one layer of insulating auxiliary dams may be further disposed over the insulating dams 1802. For example, a first insulating auxiliary dam 1804 may be disposed on the laser blocking layer 1803, and a second insulating auxiliary dam 1805 may be disposed on the first insulating auxiliary dam 1804. The total height of the insulating dams 1802 may be further increased due to the presence of the first insulating auxiliary dam 1804 and the second insulating auxiliary dam 1805.

The first insulating auxiliary dam 1804 may be disposed on the same insulating layer as the pixel definition layer 424 of FIG. 4. The second insulating auxiliary dam 1805 may be formed in the same process as a spacer that may be formed around the sub-pixel of FIG. 4. First and second insulating auxiliary dams of other exemplary embodiments described below may also be similarly applied thereto.

In an exemplary embodiment, a clad layer 1806 may be disposed between adjacent insulating dams 1802. The clad layer 1806 may overlap the edge of the laser blocking layer 1803.

Figure 19:
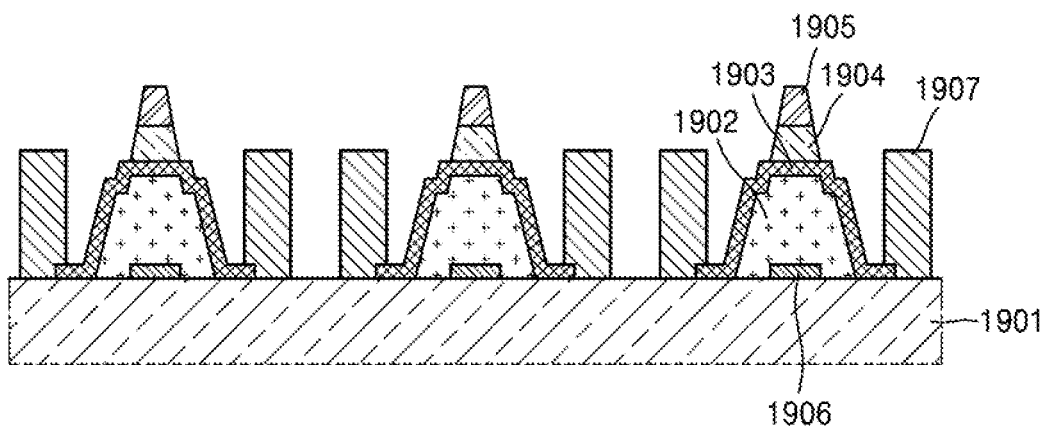

Referring to FIG. 19, a plurality of insulating dams 1902 may be disposed on an insulating layer 1901. A laser blocking layer 1903 may be disposed on the insulating dams 1902 (e.g., on the outer surface of the insulating dams 1902).

A reinforcement layer 1906 may be disposed between the insulating layer 1901 and the insulating dams 1902. The insulating dams 1902 may cover the reinforcement layer 1906.

A first insulating auxiliary dam 1904 may be disposed on the laser blocking layer 1903, and a second insulating auxiliary dam 1905 may be disposed on the first insulating auxiliary dam 1904.

In an exemplary embodiment, a clad layer 1907 may be disposed between adjacent insulating dams 1902. The clad layer 1907 may overlap the edge of the laser blocking layer 1903.

Figure 20:
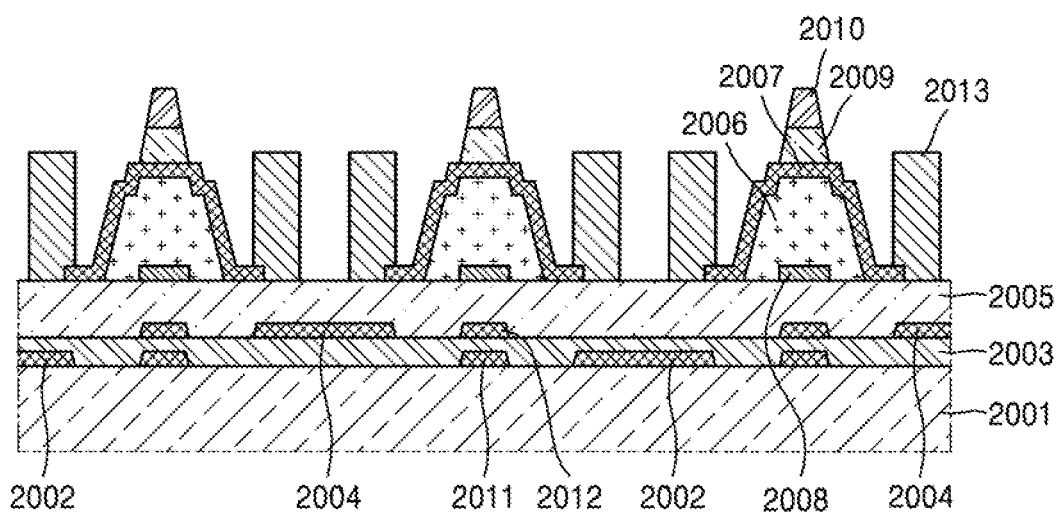

Referring to FIG. 20, a first laser blocking layer 2002 may be disposed on a first insulating layer 2001. A second insulating layer 2003 may cover the first laser blocking layer 2002. A second laser blocking layer 2004 may be disposed on the second insulating layer 2003. A third insulating layer 2005 may cover the second laser blocking layer 2004.

An insulating dam 2006 may be disposed on the third insulating layer 2005. A third laser blocking layer 2007 may be disposed on the insulating dam 2006 (e.g., on the outer surface of the insulating dam 2006). A reinforcement layer 2008 may be disposed between the third insulating layer 2005 and the insulating dams 2006. The insulating dams 2006 may cover the reinforcement layer 2008.

A first insulating auxiliary dam 2009 may be disposed on the third laser blocking layer 2007, and a second insulating auxiliary dam 2010 may be disposed on the first insulating auxiliary dam 2009.

At least one reinforcement layer 2011 or 2012 may be further disposed under the insulating dams 2006 and over the first insulating layer 2001 or the second insulating layer 2003.

In an exemplary embodiment, a clad layer 2013 may be disposed between adjacent insulating dams 2006. The clad layer 2013 may overlap the edge of the third laser blocking layer 2007.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A display apparatus, comprising:
a substrate including a front surface and a rear surface, the substrate having a hole that passes from the front surface to the rear surface, the hole of the substrate having a closed-loop shape in a plan view;
a plurality of light-emitting, elements on the front surface of the substrate and defining a display area around the hole, each of the plurality of light-emitting elements being electrically connected to a transistor and a capacitor;
a first dam and a second dam spaced apart from each in a non-display area of the substrate disposed between the hole and the display area, and extending along an edge of the hole of the substrate to entirely surround the hole of the substrate in the plan view; and
an encapsulation layer over the plurality of light-emitting, elements and comprising a first inorganic layer overlapping the first and second dams, a second inorganic layer, and an organic layer between the first inorganic layer and the second inorganic layer,
wherein a portion of the first inorganic layer and a portion of the second inorganic layer contact each other in an area between the hole and the display area,
wherein the portion of the second inorganic layer contacts the portion of the first inorganic layer at a lowermost part of the first inorganic layer between the first dam and the second dam.
2. The display apparatus of claim 1, further comprising:
an additional organic layer over the second inorganic layer of the encapsulation layer.
3. The display apparatus of claim 2, wherein a contact part between the portion of the first inorganic layer and the portion of the second inorganic layer is overlapped by the additional organic layer.

4. The display apparatus of claim 2, wherein the additional organic layer directly contacts an upper surface of a portion of the second inorganic layer of the encapsulation layer.

5. The display apparatus of claim 2, wherein an edge of the additional organic layer is closer to the hole than an edge of the organic layer of the encapsulation layer.

6. The display apparatus of claim 2, wherein an upper surface of the additional organic layer is substantially flat.

7. The display apparatus of claim 1, wherein the additional organic layer comprises a first portion and a second portion, the first portion being between the first dam and the second dam, and the second portion overlapping the first dam and having a thickness less than that of the first portion.

8. The display apparatus of claim 1, further comprising:
a plurality of metal lines being more adjacent to the display area than the first and second dams and being spaced apart from each other.

9. The display apparatus of claim 8, wherein the plurality of metal lines comprises a multi-layered structure.

10. The display apparatus of claim 9, wherein the multi-layered structure comprises aluminum (Al).

11. The display apparatus of claim 8, wherein the plurality of metal lines comprises a same material as an electrode of the transistor or the capacitor,
wherein the transistor comprises a semiconductor layer, a gate electrode overlapping a channel region of the semiconductor layer, and a first electrode connected to a source or drain region of the semiconductor layer, and
wherein the gate electrode or the first electrode comprises a multi-layered structure.

12. The display apparatus of claim 11, wherein the multi-layered structure comprises a three-layered structure of titanium (Ti), aluminum (Al), and titanium (Ti).

13. The display apparatus of claim 1, further comprising:
a plurality of metal layers more adjacent to the hole than the first and second dams.

14. The display apparatus of claim 13, wherein the transistor comprises a semiconductor layer, a gate electrode overlapping a channel region of the semiconductor layer, and a first electrode connected to a source region or drain region of the semiconductor layer, and wherein the plurality of metal layers comprises a first metal layer that comprises a same material as the first electrode.

15. The display apparatus of claim 14, wherein the plurality of metal layers further comprises a second metal layer and a third metal layer, and the first metal layer overlaps the second and third metal layers with an insulating layer which is disposed between the first metal layer and the second and third metal layers.

16. A display apparatus, comprising:
a substrate including a front surface and a rear surface, the substrate having a hole that passes from the from surface to the rear surface, the hole of the substrate having a closed-loop shape in a plan view;
a plurality of light-emitting elements on the front surface of the substrate and defining a display area around the hole, each of the plurality of light-emitting elements being electrically connected to a transistor and a capacitor;
a first dam in a no area of the substrate disposed between the display area and the hole of the substrate, and extending along an edge of the hole of the substrate to entirely surround the hole of the substrate in the plan view; and
a plurality of metal lines in the non-display area,
wherein the plurality of metal lines is disposed between the display area and the hole of the substrate, and is closer to the display area than the first dam, and wherein each of the plurality of metal lines has a closed-loop shape.

17. The display apparatus of claim 16, wherein the plurality of metal lines comprises a first metal line and second metal line that are spaced apart from each other in a direction from the display area to the hole.

18. The display apparatus of claim 16, further comprising:
at least one inorganic insulation layer interposed between the substrate and the plurality of metal lines.

19. The display apparatus of claim 16, wherein the plurality of metal lines comprises a multi-layered structure.

20. The display apparatus of claim 19, wherein the multi-layered structure comprises aluminum (Al).

21. The display apparatus of claim 16, wherein the plurality of metal lines comprises a same material as an electrode of the transistor or the capacitor.

22. The display apparatus of claim 21, wherein the transistor comprises a semiconductor layer, a gate electrode overlapping a channel region of the semiconductor layer, and a first electrode connected to a source or drain region of the semiconductor layer, and wherein the gate electrode or the first electrode comprises a multi-layered structure.

23. The display apparatus of claim 22, wherein the multi-layered structure comprises a three-layered structure of titanium (Ti), aluminum (Al), and titanium (Ti).

24. The display apparatus of claim 16, further comprising:
plurality of metal layers more adjacent to the hole than the first dam.

25. The display apparatus of claim 24, wherein the transistor comprises a semiconductor layer, a gate electrode overlapping a channel region of the semiconductor layer, and a first electrode connected to a source region or drain region of the semiconductor layer, and wherein the plurality of metal layers comprises a first metal layer that comprises a same material as the first electrode.

26. The display apparatus of claim 25, wherein the plurality of metal layers further comprises a second metal layer and a third metal layer, and the first metal layer overlaps the second and third metal layers with an insulating layer which is disposed between the first metal layer and the second and third metal layers.

27. The display apparatus of claim 16, further comprising:
a second dam that is closer to the hole than the first dam; and
an encapsulation layer over the plurality of light-emitting, elements and comprising a first inorganic layer, a second inorganic layer on the first inorganic layer, and an organic layer between the first inorganic layer and the second inorganic layer.

28. The display apparatus of claim 27, wherein a portion of the first inorganic layer and a portion of the second inorganic layer contact each other in an area between the display area and the hole of the substrate.

29. The display apparatus of claim 27, further comprising:
an additional organic layer over the second inorganic layer of the encapsulation layer.

30. The display apparatus of claim 29, wherein an edge of the additional organic layer is closer to the hole than an edge of the organic layer of the encapsulation layer.

31. The display apparatus of claim 29, wherein the additional organic layer comprises a first portion and a second portion, the first portion being between the first dam and the second dam, and the second portion overlapping the first dam and having a thickness less than that of the first portion.

32. A display apparatus, comprising:
a. substrate including a front surface and a rear surface, the substrate having a hole that passes from the front surface to the rear surface, the hole of the substrate having a closed-loop shape in a plan view;
a plurality of light-emitting elements on the front surface of the substrate and defining a display area around the hole, each of the plurality of light-emitting elements being electrically connected to a transistor and a capacitor;
at least one dam in a non-display area of the substrate disposed between the display, area and the hole of the substrate, and extending along an edge of the hole of the substrate to entirely surround the hole of the substrate in the plan view; and
a plurality of metal layers in the non-display area,
wherein the plurality of metal layers is disposed between the display area and the hole of the substrate, and is closer to the hole than the at least one dam.

33. The display apparatus of claim 32, wherein the at least one dam comprises a first dam and a second dam that are spaced apart from each other, and wherein the plurality of metal layers are more adjacent to the hole than the first and second dams.

34. The display apparatus of claim 33, further comprising:
a plurality of metal lines more adjacent to the display area than the at least one dam.

35. The display apparatus of claim 34, wherein the plurality of metal lines comprises a multi-layered structure.

36. The display apparatus of claim 35, wherein the multi-layered structure comprises aluminum (Al).

37. The display apparatus of claim 34, wherein the plurality of metal lines comprises a same material as an electrode of the transistor or the capacitor,
wherein the transistor comprises a semiconductor layer, a gate electrode overlapping a channel region of the semiconductor layer, and a first electrode connected to a source or drain region of the semiconductor layer, and
wherein the gate electrode or the first electrode comprises a multi-layered structure.

38. The display apparatus of claim 37, wherein the multi-layered structure comprises a three-layered structure of titanium (Ti), aluminum (Al), and titanium (Ti).

39. The display apparatus of claim 33, further comprising:
an encapsulation layer over the plurality of light-emitting elements and comprising a first inorganic layer, a second inorganic layer on the first inorganic layer, and an organic layer between the first inorganic layer and the second inorganic layer.

40. The display apparatus of claim 39, wherein a portion of the first inorganic layer and a portion of the second inorganic layer contact each other in an area between the display area and the hole of the substrate.

41. The display apparatus of claim 39, further comprising:
an additional organic layer over the second inorganic layer of the encapsulation layer.

42. The display apparatus of claim 41, wherein an edge of the additional organic layer is closer to the hole than an edge of the organic layer of the encapsulation layer.

43. The display apparatus of claim 41, wherein the additional organic layer comprises a first portion and a second portion, the first portion being between the first dam and the second dam, and the second portion overlapping the first dam and having a thickness less than that of the first portion.

44. The display apparatus of claim 43, wherein an upper surface of the additional organic layer is substantially flat.

45. The display apparatus of claim 32, wherein the transistor comprises a semiconductor layer, a gate electrode overlapping a channel region of the semiconductor layer, and a first electrode connected to a source or drain region of the semiconductor layer, and wherein the plurality of metal layers comprises a first metal layer that comprises a same material as the first electrode.

46. The display apparatus of claim 45, wherein the plurality of metal layers further comprises a second metal layer and a third metal layer, and the second and third metal layers are overlapped by the first metal layer.

47. The display apparatus of claim 46, further comprising:
an insulation layer that is under the first metal lay and over the second and third metal layers.

48. The display apparatus of claim 32, wherein each of the plurality of metal lines has a closed-loop shape.

49. A display apparatus, comprising:
a substrate including a front surface and a rear surface;
a plurality of light-emitting elements on the front surface of the substrate and defining an active area that surrounds an inactive area, each of the plurality of light-emitting elements being electrically connected to a transistor and a capacitor;
an inorganic insulating layer on the substrate;
at least one dam on the front surface of the substrate and surrounding the inactive area, wherein the at least one dam comprises a first dam and a second dam that are in the inactive area between the hole and the active area and surround the hole, each of the first and second dams comprises multi-layered insulating layers, and a lowest layer of the multi-layered insulating layers of the first dam is separated from a lowest layer of the multi-layered insulating layers: of the second dam; and
an encapsulation member over the plurality of light-emitting elements and comprising an inorganic layer,
wherein a bottom surface of the first dam and a bottom surface of the second dam are respectively in direct contact with an upper surface of the inorganic insulating layer.

* * * * *